(12) United States Patent
Sneh et al.

(10) Patent No.: US 6,503,330 B1
(45) Date of Patent: Jan. 7, 2003

(54) APPARATUS AND METHOD TO ACHIEVE CONTINUOUS INTERFACE AND ULTRATHIN FILM DURING ATOMIC LAYER DEPOSITION

(75) Inventors: Ofer Sneh, Mountain View, CA (US); Thomas E. Seidel, Sunnyvale, CA (US); Carl Galewski, Aromas, CA (US)

(73) Assignee: Genus, Inc., Sunnyvale, CA (US)

( * ) Notice: Subject to any disclaimer, the term of this patent is extended or adjusted under 35 U.S.C. 154(b) by 0 days.

(21) Appl. No.: 09/470,279

(22) Filed: Dec. 22, 1999

(51) Int. Cl.[7] .............................................. C23C 16/00
(52) U.S. Cl. ............................... 118/715; 118/723 ME; 118/723 IR; 118/723 ER
(58) Field of Search .......................... 118/715, 723 ME, 118/723 IR, 723 ER

(56) References Cited

U.S. PATENT DOCUMENTS

| | | |
|---|---|---|
| 4,058,430 A | 11/1977 | Suntola et al. |
| 4,389,973 A | 6/1983 | Suntola et al. |
| 4,413,022 A | 11/1983 | Suntola et al. |
| 4,416,933 A | 11/1983 | Antson et al. |
| 4,533,410 A | 8/1985 | Ogura et al. ................ 148/175 |
| 4,533,820 A | 8/1985 | Shimizu ..................... 219/411 |
| 4,689,247 A | 8/1987 | Doty et al. ............... 427/126.1 |
| 4,828,224 A | 5/1989 | Crabb et al. ................ 251/298 |
| 4,836,138 A | 6/1989 | Robinson et al. ........... 118/666 |
| 4,846,102 A | 7/1989 | Ozias ......................... 118/730 |
| 4,867,952 A * | 9/1989 | Baumann et al. ........... 423/210 |
| 4,907,862 A | 3/1990 | Suntola et al. |
| 4,913,929 A | 4/1990 | Moslehi et al. ............... 427/39 |
| 4,975,252 A | 12/1990 | Nishizawa et al. .......... 422/245 |
| 4,976,996 A | 12/1990 | Monkowski et al. ..... 427/255.5 |
| 4,993,360 A | 2/1991 | Nakamura ................. 118/719 |
| 5,000,113 A | 3/1991 | Wang et al. ................ 118/723 |
| 5,015,503 A | 5/1991 | Varrin, Jr. et al. ....... 427/255.2 |
| 5,077,875 A | 1/1992 | Hoke et al. ................. 29/25.01 |
| 5,078,851 A | 1/1992 | Nishihata et al. ......... 204/298.4 |
| 5,119,760 A | 6/1992 | McMillan et al. .......... 118/722 |
| 5,156,820 A | 10/1992 | Wong et al. ........... 422/186.05 |
| 5,194,401 A | 3/1993 | Adams et al. ............... 437/173 |
| 5,204,314 A | 4/1993 | Kirlin et al. .................... 505/1 |
| 5,270,247 A | 12/1993 | Sakuma et al. ............. 437/133 |
| 5,281,274 A | 1/1994 | Yoder .......................... 118/697 |
| 5,294,778 A | 3/1994 | Carman et al. ............. 219/385 |
| 5,304,247 A * | 4/1994 | Kondo et al. ............... 118/715 |
| 5,320,680 A | 6/1994 | Learn et al. ................. 118/724 |
| 5,336,327 A | 8/1994 | Lee ............................. 118/730 |
| 5,484,484 A | 1/1996 | Yamaga et al. ............. 118/719 |
| 5,582,866 A | 12/1996 | White ...................... 427/248.1 |
| 5,616,208 A * | 4/1997 | Lee ............................. 156/345 |
| 5,693,139 A | 12/1997 | Nishizawa et al. ........... 117/89 |
| 5,702,530 A * | 12/1997 | Shan et al. ........... 118/723 MP |
| 5,711,811 A | 1/1998 | Suntola et al. |
| 5,749,974 A | 5/1998 | Habuka et al. ............. 118/725 |
| 5,788,447 A | 8/1998 | Yonemitsu et al. ......... 414/217 |
| 5,851,849 A | 12/1998 | Comizzoli et al. ............ 438/38 |

(List continued on next page.)

FOREIGN PATENT DOCUMENTS

| | | | |
|---|---|---|---|
| EP | 0 442 490 A1 | 8/1991 | ........... C30B/25/02 |
| EP | 0 442 490 B1 | 5/1995 | |

(List continued on next page.)

OTHER PUBLICATIONS

Bedair, S.M. et al., "Atomic Layer Epitaxy of III–V Binary Compounds", Appl. Phys. Lett. (1985) 47(1): 51–3.

(List continued on next page.)

*Primary Examiner*—Jeffrie R. Lund
(74) *Attorney, Agent, or Firm*—Blakely Sokoloff Taylor & Zafman LLP

(57) ABSTRACT

A method and apparatus for performing atomic layer deposition in which a surface of a substrate is pretreated to make the surface of the substrate reactive for performing atomic layer deposition.

15 Claims, 4 Drawing Sheets

U.S. PATENT DOCUMENTS

| | | | |
|---|---|---|---|
| 5,876,503 A | * 3/1999 | Roeder et al. | 118/715 |
| 5,879,459 A | 3/1999 | Gadgil et al. | |
| 5,916,365 A | 6/1999 | Sherman | |
| 5,935,338 A | 8/1999 | Lei et al. | 118/725 |
| 6,007,330 A | 12/1999 | Gauthier | 432/47 |
| 6,015,590 A | 1/2000 | Suntola et al. | |
| 6,042,652 A | 3/2000 | Hyun et al. | 118/719 |
| 6,050,216 A | 4/2000 | Szapucki et al. | 118/723 |
| 6,077,775 A | 6/2000 | Stumborg et al. | 438/643 |
| 6,090,442 A | 7/2000 | Klaus et al. | |
| 6,124,158 A | 9/2000 | Dautartas et al. | |
| 6,139,700 A | 10/2000 | Kang et al. | 204/192.17 |
| 6,143,659 A | 11/2000 | Leem | 438/688 |
| 6,174,377 B1 | * 1/2001 | Doering et al. | 118/729 |
| 6,200,893 B1 | 3/2001 | Sneh et al. | |
| 6,270,572 B1 | 8/2001 | Kim et al. | 117/93 |
| 6,305,314 B1 | 10/2001 | Sneh et al. | |
| 2001/0045187 A1 | * 11/2001 | Uhlenbrock | 118/715 |

FOREIGN PATENT DOCUMENTS

| | | | |
|---|---|---|---|
| EP | 0 511 264 B1 | 8/1995 | |
| JP | 60-10625 | 1/1985 | H01L/21/302 |
| JP | 2-152251 | 6/1990 | H01L/21/68 |
| JP | 5-152215 | 6/1993 | H01L/21/205 |
| JP | 8-236459 | 9/1996 | H01L/21/205 |
| JP | 10-102256 | 4/1998 | H01L/16/44 |
| WO | WO-91/10510 A1 | 7/1991 | |

OTHER PUBLICATIONS

Ozeki, M. et al., "Kinetic Processes In Atomic–Layer Epitaxy of GaAs and A1As Using A Pulsed Vapor–Phase Method", J. Vac. Sci. Technol. (1987) B5(4): 1184–86.

O'Hanlon, J. "Gas Release From Solids", A Users Guide to Vacuum Technology (1989) Chap. 4: 56–71.

Watanabe, A. et al., "The Mechanism of Self–Limiting Growth of Atomic Layer Epitaxy of GaAs By Metalorganic Molecular Bean Epitaxy Using Trimethylgallium and Arsine", Jpn.J. of Appl. Phys. (1989) 28(7): L 1080–82.

Suntola, T. "Atomic Layer Epitaxy", Material Science Reports (1989) 4: 261–312.

Higashi, G. et al., "Sequential Surface Chemical Reaction Limited Growth of High Quality Al2O3 Dielectrics", Appl. Phys. Lett. (1989) 55(19): 1963–5.

Colas, E. et al., "Atomic Layer Epitaxy of Device Quality GaAs", Appl. Phys. Lett. (1989) 55(26): 2769–71.

Nishizawa, J. et al., "Molecular Layer Epitaxy of Silicon", J. Cryst. Growth (1990) 99:502–5.

Sakaue, H. et al., "Digital Chemical Vapor Deposition of SiO2 Using A Repetitive Reaction of Triethysilane/ Hydrogen and Oxidation", Jpn. J. of Appl. Phys. (1990) 30(. L124–7.

Roth, A. "The Vacuum", Vacuum Technology (1990) Chap. 1: 1–7 and Chap. 2: 28–45.

McDermott, B. et al., "Ordered GaInP by Atomic–Layer Epitaxy", J. Cryst. Growth (1991) 107(1–4): 96–101.

Yokoyama, H. et al., "Atomic Layer Epitaxy of GaAs Using Nitrogen Carrier Gas", Appl. Phys. Lett. (1991) 59(17): 2148–49.

Yamaga, S. and Yoshikawa, A. "Atomic Layer Epitaxy of ZnS by a New Gas Supplying System in Low–Pressure Metalorganic Vapor Phase Epitaxy", J. Cryst. Growth (1992) 117: 152–155.

Gotoh, J. et al., "Low–Temperature Growth of ZnSe–Based Pseudomorphic Structures By Hydrogen–Radical–Enhanced Chemical Vapor Deposition", J. Cryst. Growth (1992) 117: 85–90.

Suntola, T. "Cost Effective Processing by Atomic Layer Epitaxy", Thin Solid Films (1993) 225: 96–8.

Ritala, M. et al., "Growth of Titanium Dioxide Thin Films By Atomic Layer Epitaxy", Thin Solid Films, (1993) 225: 288–95.

Kattelus, H. et al., "Layered Tantalum–Aluminum Oxide Films Deposited By Atomic Layer Epitaxy", Thin Solid Films (1993) 225: 296–98.

Koleske, D. et al., "Surface Morphology of Si on Si (100) Grown Below 500 Degrees C Using H/C1 Exchange Chemistry", J. Appl. Phys. (1993) 74(6): 4245–7.

Fujiwara, H. et al., "Low Temperature Grown of ZnSxSe1–x Alloys Fabricated by Hydrogen Radical Enhanced Chemical Vapor Deposition in an Atomic Layer Epitaxy Mode", J. Appl. Phys. (1993) 74(9): 5510–5.

Somorjai, G. "An introduction to surface Chemistry and Catalysis" (1994) Chap. 1: 12–7.

Ritala, M. et al., "Surface Roughness Reduction in Atomic Layer Epitaxy Growth of Titanium Dioxide Thin Films", Thin Solid Films (1994) 249: 155–62.

Imai, S. et al., "Hydrogen Atom Assisted ALE of Silicon", Appl. Surf. Sci. (1994) 82–83: 322–6.

Sugahara, S. et al., "Atomic Layer Epitaxy of Germanium" Appl. Surf. Sci. (1994) 82–83: 380–6.

Dillon, A.C. et al., "Surface Chemistry of A12O3 Deposition Using Al(CH3)3 and H2O in a Binary Raction Sequence", Surf. Sci. (1995) 322(1–3): 230–42.

Ott, A. W. et al., "Modification of Porous Alumina Membranes Using Al3O3 Atomic Layer Controlled Deposition", Chem. Of Materials (1997) 9(3): 707–14.

Bedair, S.M. Atomic Layer Epitaxy Deposition Processes, J. Vac. Sci. Technol. B 12(1), Jan./Feb. 1994 pp. 179–185.

Colter, P.C. et al. Atomic Layer Epitaxy of Device Quality GaAs with a 0.6 um/h Growth Rate, Appl. Phys. Lett., vol. 59, No. 12, Sep. 16, 1991.

Hukka, T. et al. Novel Method for Chemical Vapor Deposition and Atomic Layer Epitaxy Using Radical Chemistry, Thin Solid Films 225 (1993) 212–218.

Kodama, K. et al. In situ x–Ray Photoelectron Spectroscopic Study of GaAs Grown by Atomic Layer Epitaxy Appl. Phys. Lett., vol. 54, No. 7, Feb. 13, 1989.

Koleske, D.D. et al. Atomic Layer Epitaxy of Si on Ge(100) Using Si2C16 and Atomic Hydrogen, Appl. Phys.Lett. 64 (7), Feb. 14, 1994.

Lubben, D. et al. UV Photostimulated Si Atomic–Layer Epitaxy, Mat. Res. Soc. Symp. Proc. vol. 222. 1991 Material Reseach Society 177–187.

Sneh, O. et al. Proceedings of 4th Internat. Sympos on Atomic Layer Epitaxy, Linz, Austria, Jul. 1996, Appl. Surf. Sci. 112 (1997).

Suntola, T. Atomic Layer Epitaxy, Handbook of Crystal Growth, vol. 3 1994, pp., 605–663.

Yarmoff, J.A. et al. Atomic Layer Epitaxy of Silicon by Dichlorosilane Studies with Core Level Spectroscopy, J.Vac. Sci. Technol. A 10(4), Jul./Aug. 1992.

George, S.M. et al., Surface Chemistry for Atomic Layer Growth, J. Phys. Chem. 1996, pp. 13121–13131:100.

Imai, Shigeru, et al., Atomic Layer Epitaxy of Si Using Atomic H, Thin Solid Films, 225, 168 (1993).

Ott, A.W. et al. Al303 Thin Film Growth on Si (100) Using Binary Reaction Sequence Chemistry, Thin Solid Films, 292 (1997) pp. 135–144.

Ott, A.W. et al. Proceedings of 4th Internat. Sympos on Atomic Layer Epitaxy, Linz, Austria, Jul. 1996, Appl. Surf. Sci. 112 pp. 205–215 (1997).

Sneh, O. et al. Atomic Layer Growth of SiO2 on Si (100) Using SiCl4 and H20 in a Binary Reaction Sequence, Surf. Sci. 334 pp. 135–152 (1995).

Suntola, T., Atomic Layer Epitaxy, Thin Solid Films, 216, (1992) pp. 84–89.

Suntola, T., Surface Chemistry of Materials Deposition of Atomic Layer Level, Appl. Surf, Sci. 100/101 (1996) 391–398.

Tischler, M.A. et al., Growth and Characterization of Compound Semiconductors by Atomic Layer Epitaxy, J. Cryst. Growth 77, 89 (1986).

Farrell, J.T. et al., High Resolution Infrared Overtone Spectroscopy of N2–HF: Vibrational Red Shifts and Predissociation Rate as a Function of HF Stretching Quanta, J. Phys. Chem. 1994, pp. 6068–6074: 98.

George, S.M. et al, Atomic Layer Controlled Deposition of SiO2 and Al203 Using ABAB . . . Binary Reaction Sequence Chemistry, Applied Surface Science, 1994, pp. 460–467: 82/83.

Klaus, J.W. et al. Atomic Layer Deposition of SiO2 Using Catalyzed and Uncatalyzed Self–Limiting Surface Reactions, Surface Review and Letters, 1999, pp. 435–448: vol. 6, Nos. 3 & 4.

Klaus, J.W. et al. Growth of SiO2 at Room Temperature with the Use of Catalyzed Sequential Half Reactions, Science, Dec. 1997, pp. 1934–1936: vol. 278.

Sneh, O. et al. Adsorption and Desorption Kinetics of H20 on a Fully Hydroxylated SiO2 Surface, Surface Science 1996, pp. 61–78: vol. 364.

Sneh, O. et al. Atomic Layer Growth of SiO2 on Si(100) Using SiCl4 and H20 in a Binary Reaction Sequence, Surface Science, 1995, pp. 135–152: vol. 334.

Sneh, O. et al. Atomic Layer Growth of SiO2 on Si (100) Using the Sequential Deposition of SiCl4 and H20, Mat. Res. Symp. Proc. 1994, pp. 25–30: vol. 334.

Sneh, O. et al. Atomic Layer Showing Its Metal, European Semiconductor, Jul. 2000, pp. 33–36.

Sneh, O. et al. Diffusion of XE on a Stepped Pt(11,119) Surface, American Chemical Society, Abstract of Papers, Mar. 1993 Part 2 (235).

Sneh, O. et al. Sample Manipulator Employing a Gas–Thermal Switch Designed for High Pressure Experiments in an Ultrahigh Vacuum Apparatus, J. Vac. Sci. Technol, Mar./Apr. 1995, pp. 493–496. vol. A 13(2).

Sneh, O. et al. Thermal Stability of Hydroxyl Groups on a Well–Defined Silica Surface, J. Phy. Chem. 1995, pp. 4639–4647: vol. 99.

Sneh, O. et al. Xenon Diffusion on a Stepped Pt (11,11,9) Surface, J. Chem,. Phys., Aug. 1994, pp. 3287–3297: vol. 101 (4).

Wise, M.L. et al. Adsorption and Decomposition of Diethyldiethoxysilane on Silicon Surfaces: New Possibilities for SiO2 Deposition, J.Vac. Sci, Technol., May/Jun. 1995, pp. 865–875, vol. B 13(3).

Wise, M.L. et al. Diethyldiethoxysilane as a New Precursor for SiO2 Growth on Silicon, Mat. Res. Soc. Symp. Proc., 1994, pp. 37–43: vol. 334.

Wise, M.L. et al. Reaction Kinetics of H20 with Chlorinated Si(111)–(7×7) and Porous Silicon Surfaces, Surface Science, 1996, pp. 367–379: vol. 364.

Wise, M.L. et al. H20 Adsorption Kinetics on Si(111) 7×7 and Si(111) 7×7 Modified by Laser Annealing, J. Vac. Sci. Technol. Jul./Aug. 1995, pp. 1853–1860: vol. A 13(4).

Atomic Layer Epitaxy. T. Suntola and M. Simpson. Blackie and Son Ltd. 1990. pp. 1–39.

Atomic Layer Epitaxy. Collin H. L. Good man and Markus V. Pessa. J. Appl. Phys. 60(3), Aug. 1, 1986. The American Institute of Physics. pp. R65–R81.

* cited by examiner

APPARATUS AND METHOD TO ACHIEVE CONTINUOUS INTERFACE AND ULTRATHIN FILM DURING ATOMIC LAYER DEPOSITION

The United States Government has rights in this invention pursuant to Contract No. F33615-99-C-2961 between Genus, Inc. and the U.S. Air Force Research Laboratory.

BACKGROUND OF THE INVENTION

1. Field of the Invention

The present invention relates generally to semiconductor technology and, more particularly, to a method and apparatus for the practice of atomic layer deposition.

2. Background of the Related Art

In the manufacture of integrated circuits, many methods are known for depositing and forming various layers on a substrate. Chemical vapor deposition (CVD) and its variant processes are utilized to deposit thin films of uniform and, often times conformal coatings over high-aspect and uneven features present on a wafer. However, as device geometries shrink and component densities increase on a wafer, new processes are needed to deposit ultrathin film layers on a wafer. The standard CVD techniques have difficulty meeting the uniformity and conformity requirements for much thinner films.

One variant of CVD to deposit thinner layers is a process known as atomic layer deposition (ALD). ALD has its roots originally in atomic layer epitaxy, which is described in U.S. Pat. Nos. 4,058,430 and 4,413,022 and in an article titled "Atomic Layer Epitaxy" by Goodman et al.; J. Appl. Phys. 60(3), Aug. 1, 1986; pp. R65–R80. Generally, ALD is a process wherein conventional CVD processes are divided into single-monolayer depositions, wherein each separate deposition step theoretically reaches saturation at a single molecular or atomic monolayer thickness or less and, then, self-terminates.

The deposition is an outcome of chemical reactions between reactive molecular precursors and the substrate (either the base substrate or layers formed on the base substrate). The elements comprising the film are delivered as molecular precursors. The desired net reaction is to deposit a pure film and eliminate "extra" atoms (molecules) that comprise the molecular precursors (ligands). In a standard CVD process, the precursors are fed simultaneously into the reactor. In an ALD process, the precursors are introduced into the reactor separately, typically by alternating the flow, so that only one precursor at a time is introduced into the reactor. For example, the first precursor could be a metal precursor containing a metal element M, which is bonded to an atomic or molecular ligand L to form a volatile molecule $ML_x$. The metal precursor reacts with the substrate to deposit a monolayer of the metal M with its passivating ligand. The chamber is purged and, then, followed by an introduction of a second precursor. The second precursor is introduced to restore the surface reactivity towards the metal precursor for depositing the next layer of metal. Thus, ALD allows for single layer growth per cycle, so that much tighter thickness controls can be exercised over standard CVD process. The tighter controls allow for ultrathin films to be grown.

In practicing CVD, a nucleation step is assumed when a film of stable material is deposited on a stable substrate. Nucleation is an outcome of only partial bonding between the substrate and the film being deposited. Molecular precursors of CVD processes attach to the surface by a direct surface reaction with a reactive site or by CVD reaction between the reactive ingredients on the surface. Of the two, the CVD reaction between the reactive ingredients is more prevalent, since the ingredients have much higher affinity for attachment to each other. Only a small fraction of the initial film growth is due to direct surface reaction.

An example of nucleation is illustrated in FIGS. 1–3. FIG. 1 shows a substrate 10 having bonding locations 11 on a surface of the substrate. Assuming that the CVD reaction involves a metal (M) and a ligand ($L_x$) reacting with a non-metal (A) and hydrogen ($H_z$), the adsorbed species diffuse on the surface and react upon successful $ML_x$-$AH_z$ collisions. However, the reaction does not occur at all of the potential attachment (or bonding) locations 11. Generally, defect sites (sites having irregular topology or impurity) are likely to trap molecular precursors for extended times and, therefore, have higher probability to initiate nucleation. In any event, as shown in FIG. 1, the bonding of the precursor to the surface occurs at only some of the bonding locations 12.

Subsequently, as shown in FIG. 2, the initial bonding sites 12 commence to further grow the thin film material on the surface of the substrate 10. The initial reaction products on the surface are the nucleation seed, since the attached products are immobile and diffusing molecular precursors have a high probability to collide with them and react. The process results in the growing of islands 13 on the substrate surface together with the continuous process of creating new nucleation sites 14. However, as the islands 13 grow larger, the formation of new nucleation seeds is suppressed because most of the collisions occur at the large boundaries of the islands 13.

As the islands 13 enlarge three-dimensionally, most of the adsorption and reaction processes occur on the island surfaces, especially along the upper surface area of the islands 13. Eventually, this vertical growth results in the islands becoming grains. When the grains finally coalesce into a continuous film, the thickness could be on the order of 50 angstroms. However, as shown in FIG. 3, the separated nucleation sites can result in the formation of grain boundaries and voids 15 along the surface of the substrate, where potential bonding sites failed to effect a bond with the precursor(s). The grain boundaries and voids 15 leave bonding gaps along the surface of the substrate so that substantial film height will need to be reached before a continuous upper surface of the film layer is formed.

Although the results described above from nucleation is a problem with the standard CVD process, the effect is amplified with ALD. Since ALD utilizes one precursor at a time, the initial bonding will occur due to surface reaction of the initial precursor with sparse surface defects. Accordingly, seed nucleation sites 12 are very sparse (more sparse than CVD) and nucleation proceeds by growing ALD layers on these few seed sites. As a result, the nuclei grow three-dimensional islands 13 and coalesce only at thickness that are comparable to the distance between the nucleation seeds. That is, the voids 15 could be much larger in size, so that a much higher structure is needed to provide a continues upper surface for the film when only ALD is used.

Accordingly, if an ALD film can initiate growth on a substrate predominantly by nucleation, the film grows discontinuously for a much thicker distance. Ultimately a much thicker film is practically needed in the case of ALD to achieve continuous film, than that which can be obtained from CVD processes.

The present invention is directed to providing a technique to deposit ALD thin films of reduced thickness that has continuous interface and film.

SUMMARY OF THE INVENTION

A method and apparatus for performing atomic layer deposition in which a surface of a substrate is pretreated to make the surface of the substrate reactive for performing atomic layer deposition (ALD). As a result, the ALD process can start continuously without nucleation or incubation, so that continuous interfaces and ultrathin films are formed.

DETAILED DESCRIPTION OF THE INVENTION

The practice of atomic layer deposition (ALD) to deposit a film layer onto a substrate, such as a semiconductor wafer, requires separately introducing molecular precursors into a processing reactor. The ALD technique will deposit an ultrathin film layer atop the substrate. The term substrate is used herein to indicate either a base substrate or a material layer formed on a base substrate, such as a silicon substrate. The growth of the ALD layer follows the chemistries associated with chemical vapor deposition (CVD), but the precursors are introduced separately.

In an example ALD process for practicing the present invention, the first precursor introduced is a metal precursor comprising a metal element M bonded to atomic or molecular ligand L to make a volatile molecule $ML_x$ (the x, y and z subscripts are utilized herein to denote integers 1, 2, 3, etc.). It is desirable that the $ML_x$ molecule bond with a ligand attached to the surface of the substrate. An example ligand is a hydrogen-containing ligand, such as AH, where A is a nonmetal element bonded to hydrogen. Thus, the desired reaction is noted as $AH+ML_x \rightarrow AML_y+HL$, where HL is the exchange reaction by-product.

However, in a typical situation as noted in the Background section above, the substrate surface does not possess ample bonding sites for all the potential locations on the surface. Accordingly, the $ML_x$ precursor bonding to the surface can result in the formation of islands and grains which are sufficiently far apart to cause the problems noted above. In order to grow continuous interfaces and films, the present invention is practiced to pretreat the surface of the substrate prior to ALD in order to have the surface more susceptible to ALD. In the preferred embodiment the substrate surface is first treated to make the surface more reactive. This is achieved by forming reactive termination on the surface which will then react with the first ALD precursor.

Figure 1:
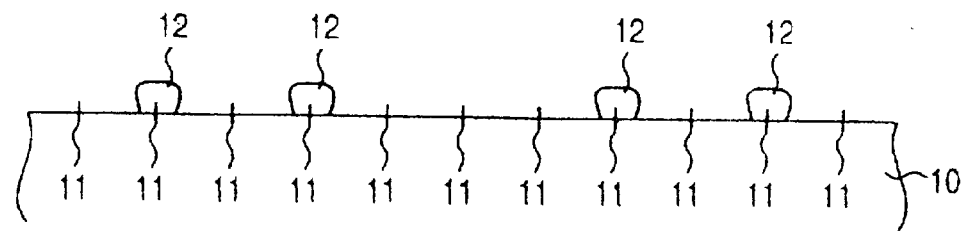
FIG. 1 is a cross-sectional diagram showing a problem encountered with prior art CVD processes, in which sparse seed nuclei are formed to initiate film growth by non-continuous nucleation.
Figure 2:
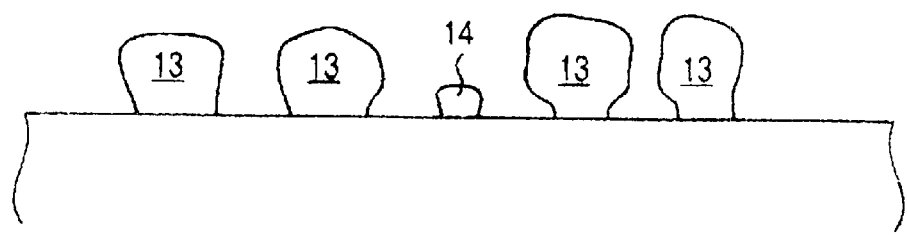
FIG. 2 is a cross-sectional diagram showing the start of nucleation emanating from the chemical attachment shown in FIG. 1, in which the spacing between the nucleation sites results in the formation of separated islands as the deposition process progresses.
Figure 3:
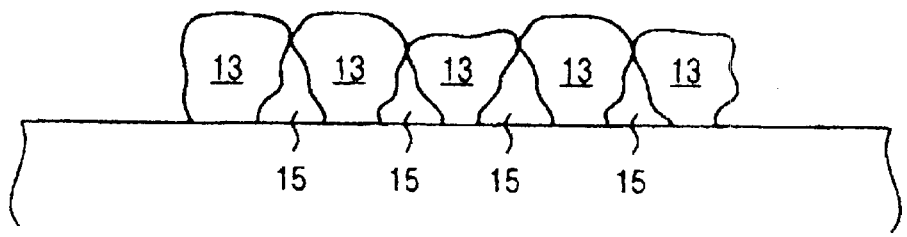
FIG. 3 is a cross-sectional diagram showing the result of further growth of the deposited layer of FIG. 2, in which the formation of grain boundaries and voids requires more than desirable thickness to be deposited to obtain a continuous layer at the surface.
Figure 4:
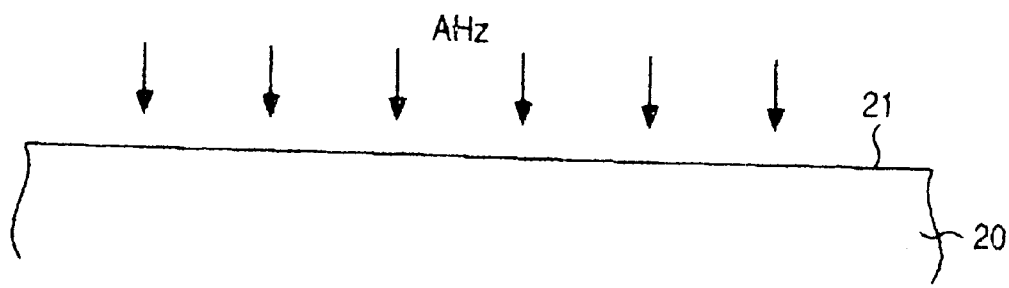
FIG. 4 is a cross-sectional diagram showing an embodiment of the present invention in pretreating a surface of a substrate to activate the surface, prior to performing atomic layer deposition to grow an ultra thin film layer.

FIG. 4 shows one embodiment for practicing the present invention. In FIG. 4, a substrate 20 (again, substrate is used herein to refer to either a base substrate or a material layer formed on a base substrate) is shown upon which ALD is performed. Instead of applying the $ML_x$ precursor initially onto the substrate 20, one or more radical specie(s), including such species as oxygen, hydrogen, OH, $NH_2$, Cl and F, is introduced to react with a surface 21 of the substrate 20. The species can be remote plasma generated and carried to the processing chamber. The reactive species can be selected to react with most surfaces, however, the particular specie selected will depend on the surface chemistry. A given specie is utilized to modify the surface 21. The reactive specie typically will modify the surface by exchanging other surface species and/or attaching to previously reconstructed sites.

For example, $SiO_2$ surface with approximately 100% siloxane SiOSi bridge is generally inert. OH, H or O radical exposure can efficiently insert HOH into the SiOSi to generate 2 Si—OH surface species that are highly reactive with $ML_x$ molecular precursor. In FIG. 4, a generic $AH_z$ reaction is shown to treat the surface 21 of the substrate 20. A number of example reactions using a particular species to treat various surfaces is described later below.

Figure 5:
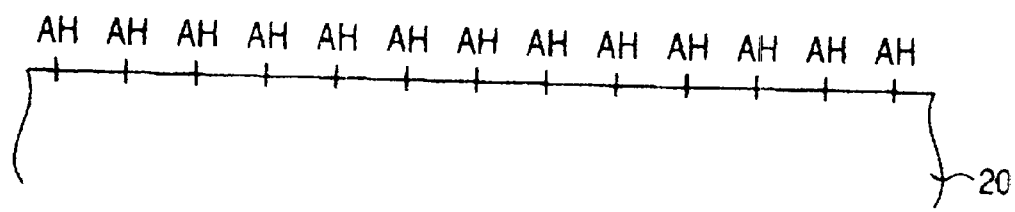
FIG. 5 is a cross-sectional diagram showing the presence of many more active sites on the surface of the substrate after surface pretreatment shown in FIG. 4 is performed.
Figure 6:
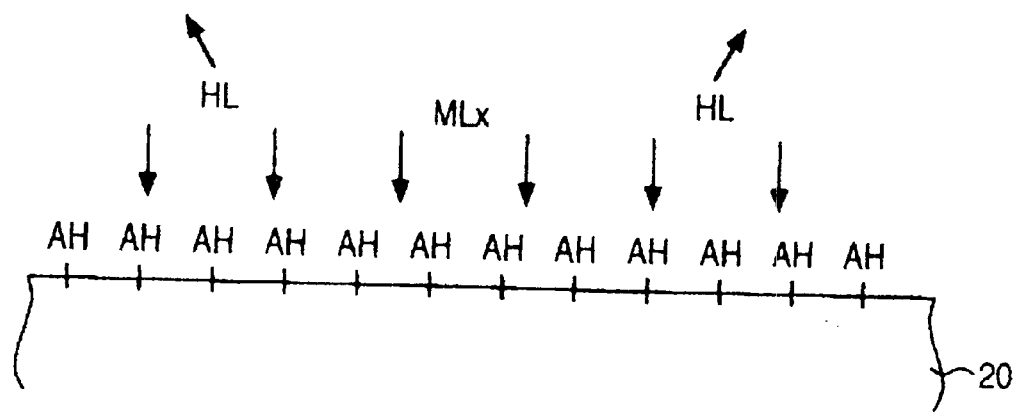
FIG. 6 is a cross-sectional diagram showing a first sequence for performing ALD when a first precursor is introduced to the prepared surface of FIG. 5.

The introduction of the pretreatment plasma into the processing chamber containing the substrate 20 results in the formation of surface species at various desired bonding sites. Thus, as shown in FIG. 5, the surface is shown containing AH sites. It is desirable to have the AH species at many of the potential bonding sites. Subsequently, as shown in FIG. 6, the first precursor $ML_x$ is introduced to start the ALD process for growing a film layer having the composition MA.

It should be noted that the prior art practice of performing ALD commences by the introduction of $ML_x$. Since the prior art does not pretreat the surface 21, there is a tendency for the surface to have lot less potential bonding sites. That is, there are lot less AH sites on non-treated surfaces versus the number available for the pretreated surface 21 shown in FIG.

6. Accordingly, with less bonding sites on the surface, the earlier described problems associated with nucleation can occur. However, the pretreated surface 21 allows for many more bonding sites to be present on the surface to reduce the above-noted problem.

Figure 7:
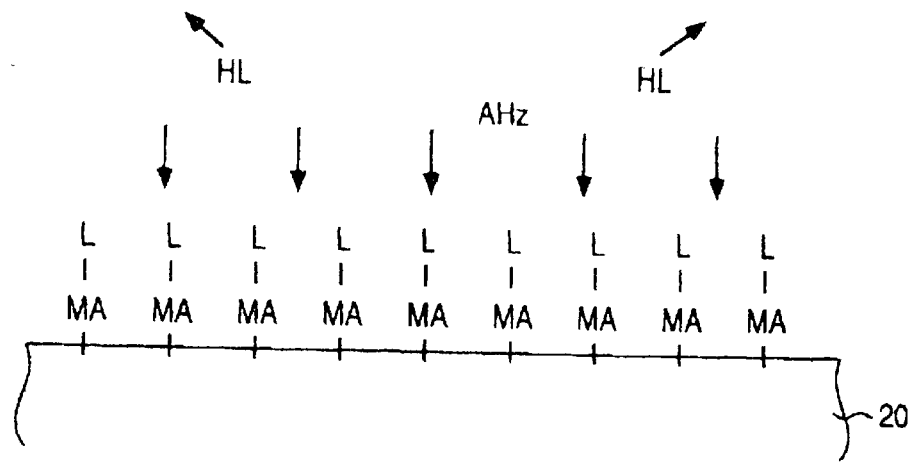
FIG. 7 is a cross-sectional diagram showing a formation of ligands on the substrate surface of FIG. 6 after the first precursor reacts with the pretreated surface and the subsequent introduction of a second precursor.
Figure 8:
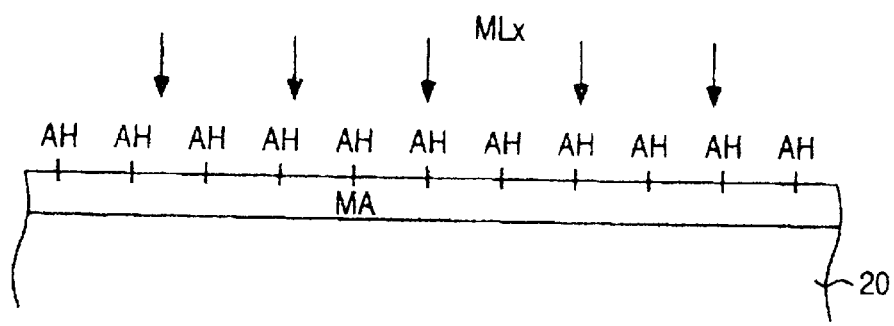
FIG. 8 is a cross-sectional diagram showing the restoration of the substrate surface of FIG. 7 so that the first precursor can be reintroduced to repeat the ALD cycle for film growth and, in addition, a continuous interface layer of the desired film is deposited on the substrate by the sequences of FIGS. 5–7.
Figure 9:
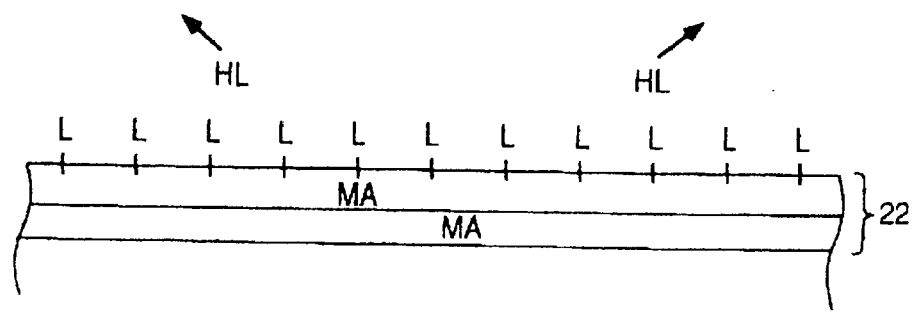
FIG. 9 is a cross-sectional diagram showing a formation of a next ALD monolayer atop the first monolayer shown in FIG. 8 to further grow the layer above the substrate one atomic/molecular layer at a time.

FIGS. 7–9 show the remaining sequence for performing ALD. After the $ML_x$ precursor is introduced, the $AH+ML_x \rightarrow AML_y+HL$ reaction occurs, wherein HL is exchanged as the reaction by-product. As shown in FIG. 7, the surface of the substrate 21 now contains the MA-L combination, which then reacts with the second precursor comprising $AH_z$. The second precursor, shown here comprising a nonmetal element A and hydrogen reacts with the L terminated sites on the surface 21. The hydrogen component is typically represented by $H_2O$, $NH_3$ or $H_2S$. The reaction $ML+AH_z \rightarrow MAH+HL$ results in the desired additional element A being deposited as AH terminated sites and the ligand L is eliminated as a volatile by-product HL. The surface 21 now has AH terminated sites, as shown in FIG. 8.

At this point of the process, the first precursor has been introduced and deposited by ALD, followed by the second precursor, also by ALD. The sequence of surface reactions restores the surface 21 to the initial condition prior to the $ML_x$ deposition, thereby completing the ALD deposition cycle. Since each ALD deposition step is self-saturating, each reaction only proceeds until the surface sites are consumed. Therefore, ALD allows films to be layered down in equal metered sequences that are identical in chemical kinematics, deposition per cycle, composition and thickness. Self-saturating surface reactions make ALD insensitive to transport non-uniformity either from flow engineering or surface topography, which is not the case with other CVD techniques. With the other CVD techniques, non-uniform flux can result in different completion time at different areas, resulting in non-uniformity or non-conformity. ALD, due to its monolayer limiting reaction, can provide improved uniformity and/or conformity over other CVD techniques.

FIG. 9 illustrates the result of a subsequent ALD formation of the MA layer when the next $ML_x$ sequence is performed to the surface of the substrate shown in FIG. 8. Thus, additional ALD deposition cycles will further grow the film layer 22 on the surface 21, one atomic or molecular layer at a time, until a desired thickness is reached. With the pretreatment of the surface 21, nucleation problems noted earlier are inhibited, due to ample bonding sites on the surface. Thus, the initial ALD layers, as well as subsequent ALD layers, will have ample bonding sites on the surface to attach the reactive species. Continuous ultrathin film layers of 50 angstroms and under can be deposited with acceptable uniformity and conformity properties when practicing the present invention.

Figure 10:
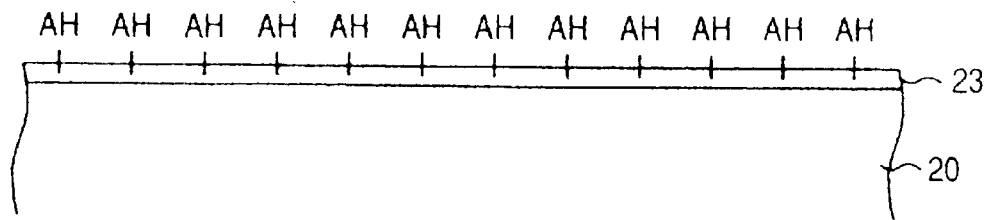
FIG. 10 is a cross-sectional diagram showing an alternative pretreatment technique in which an intermediate layer is formed to provide activation sites on the surface of the substrate prior to performing ALD.

It is appreciated that the pretreatment of the surface 21 can be achieved to deposit enough radical species to exchange with the surface. In this instance, these radical species (shown as AH in the example illustrated) provide termination sites for bonding to the $ML_x$ precursor. However, in some instances, it may be desirable to actually deposit an intermediate layer above the surface 21. In this instance, an actual intermediate layer 23 is formed above the surface 21 and in which the termination sites are actually present on this layer 23. This is illustrated in FIG. 10. Again, this layer can be deposited by a plasma process, including ALD. Then, the ALD process sequence, commencing with the deposition of $ML_x$ can commence.

An intermediate layer may be required in some instances when the substrate cannot be made reactive with either of the ALD molecular precursors by a simple attachment or exchange of surface species. The ultra thin intermediate layer 23 is deposited as part of the pretreatment process. The intermediate layer 23 provides a new surface that is reactive to one or both precursors. The layer 23 is formed having a thickness which is kept minimal, but sufficient for activation. The intermediate layer 23 may be conductive, semi-conductive or insulating (dielectric). Typically, it will match the electrical properties of either the substrate 20 or the overlying film being grown. For example, layer 23 is needed as a transition layer when W or $WN_x$ films are deposited on $SiO_2$. In this instance, $Al_2O_3$ (which is an insulator) or TiN, Ti, Ta or $Ta_xN$ (which are conductors) can be used for the intermediate layer 23.

It is to be noted further, that the intermediate layer 23 can be deposited by ALD for the pretreatment of the surface. Additionally, the surface 21 of the substrate 20 can be pretreated first by the first method described above to prepare the surface 21 for the deposition of the intermediate layer 23. Although this does require additional process, it may be desirable in some instances.

It is appreciated that the pretreatment of surface 21 is achieved by a plasma process in the above description, including the use of ALD. However, other techniques can be used instead of a plasma process to pretreat the surface 21. Thus, the surface 21 can be treated, even the intermediate layer 23 grown, by other techniques. Furthermore, a leaching process an be utilized. Since some surfaces are quite inert, a process other than reactive exchange or attachment may be desirable. For example, hydrocarbon and fluorocarbon polymers are utilized for low-k dielectrics. Adhesion of films, for sealing (insulating) or for forming a barrier (metals, metal nitrides), is difficult to achieve. In these instances, leaching hydrogen or fluorine from the top layer of the polymer can activate the surface for ALD.

Thus, a number of techniques are available for pretreating a surface of a substrate so that the surface is more active for ALD. The present invention can be implemented in practice by a number of chemistries and chemical reactions. A number of examples are provided below with relevant equations. It is to be understood that the examples listed below are provided as examples and in no way limit the invention to just these examples.

EXAMPLE 1

ALD deposition of $Al_2O_3$ on silicon. A silicon substrate is first activated (pretreated) by forming thin layers of silicon oxide ($SiO_2$) or silicon oxinitride, in which OH and/or $NH_x$ groups form the terminations. The process involves $O_2/H_2/H_2O/NH_3$ remote plasma that includes different ratios of the constituents to form the terminations prior to the introduction of the first precursor to grow the $Al_2O_3$ thin film layer on silicon.

Si—H—OH.+H.+$NH_x$.→Si—OH+Si—$NH_x$ (where "." defines a radical)

Si—OH+Al($CH_3$)$_3$→Si—O—Al($CH_3$)$_2$+$CH_4$

Si—$NH_x$+Al($CH_3$)$_3$→Si—$NH_{x-1}$—Al($CH_3$)$_2$+$CH_4$

EXAMPLE 2

ALD deposition of $AL_2O_3$ on silicon. The silicon substrate is activated by forming thin layers of $SiO_2$ that is hydroxilated by exposing HF cleaned (H terminated) silicon to a pulse of $H_2O$ at temperatures below 430° C. This process results in a self-saturated layer of $SiO_2$ that is approximately 5 angstroms thick.

Si—H+H$_2$O→Si—O—Si—OH+H$_2$
Si—OH+Al(CH$_3$)$_3$→Si—O—Al(CH$_3$)$_2$+CH$_4$

EXAMPLE 3

ALD deposition of Al$_2$O$_3$ on WN$_x$. NH$_3$/H$_2$/N$_2$ plasma is used to leach fluorine from the top layers of the WN$_x$ film and terminate the surface with NH$_x$ species. These species are reacted with trimethyl aluminum (TMA) to initiate deposition of Al$_2$O$_3$ on WN$_x$.

W$_x$N+H.+NH$_x$.→W—NH$_x$
W—NH$_x$+Al(CH$_3$)$_3$→W—NH$_{x-1}$—Al(CH$_3$)$_2$+CH$_4$

EXAMPLE 4

ALD deposition of Al$_2$O$_3$ on TiN. NH$_3$/H$_2$/N$_2$ plasma is used to terminate the surface with NH$_x$ species. These species are reacted with TMA to initiate Al$_2$O$_3$ ALD.

TiN+H.+NH$_x$.→Ti—NH$_x$
TiNH$_x$+Al(CH$_3$)$_3$→TiNH$_{x-1}$—Al(CH$_3$)$_2$+CH$_4$

EXAMPLE 5

ALD deposition of Al$_2$O$_3$ on Ti. NH$_3$/H$_2$/N$_2$ plasma is used to nitridize the surface and terminate the surface with NH$_x$ species. Maintain conditions to avoid extensive nitridization into the Ti film. The NH$_x$ species are reacted with TMA to initiate Al$_2$O$_3$ ALD.

Ti+NH$_x$.+H.→TiNH$_x$
TiNH$_x$+Al(CH$_3$)$_3$→TiNH$_{x-1}$—Al(CH$_3$)$_2$+CH$_4$

EXAMPLE 6

ALD deposition of Al$_2$O$_3$ on W. NH$_3$/H$_2$/N$_2$ plasma is used to nitridize the surface and terminate the surface with NH$_x$ species. Maintain conditions to avoid extensive nitridization into the W film. The NH$_x$ species are reacted with TMA to initiate Al$_2$O$_3$ ALD.

W+NH$_x$.+H.→WNH$_x$
W—NH$_x$+Al(CH$_3$)$_3$→W—NH$_{x-1}$—Al(CH$_3$)$_2$+CH$_4$

EXAMPLE 7

ALD deposition of Al$_2$O$_3$ on Ta. NH$_3$/H$_2$/N$_2$ plasma is used to nitridize the surface and terminate the surface with NH$_x$ species. Maintain conditions to avoid extensive nitridization into the Ta film. The NH$_x$ species are reacted with TMA to initiate Al$_2$O$_3$ ALD.

Ta+NH$_x$.+H.→TaNH$_x$
TaNH$_x$+Al(CH$_3$)$_3$→TaNH$_{x-1}$—Al(CH$_3$)$_2$+CH$_4$

EXAMPLE 8

ALD deposition of Al$_2$O$_3$ on Ta$_x$N. NH$_3$/H$_2$/N$_2$ plasma is used to terminate the surface with NH$_x$ species. The NH$_x$ species are reacted with TMA to initiate Al$_2$O$_3$ ALD.

Ta$_x$N+NH$_x$.+H.→TaNH$_x$
TaNH$_x$+Al(CH$_3$)$_3$→TaNH$_x$—Al(CH$_3$)$_2$+CH$_4$

EXAMPLE 9

ALD deposition of Ta$_2$O$_5$ on Al$_2$O$_3$. The process involves O$_2$/H$_2$/H$_2$O remote plasma that includes different ratios of the constituents. This plasma is used to terminate the surface with OH species that are reactive with TaCl$_5$.

Al$_2$O$_3$+OH.+O.+H.→Al$_2$O$_3$—OH
Al$_2$O$_3$-OH+TaCl$_5$→Al$_2$O$_3$—O—TaCl$_4$+HCl

EQUATION 10

ALD deposition of Al$_2$O$_3$ on Ta$_2$O$_5$. The process involves O$_2$/H$_2$/H$_2$O remote plasma that includes different ratios of the constituents. This plasma is used to terminate the surface with OH species that are reactive with TaCl$_5$.

Ta$_2$O$_5$+O.+H.+OH.→Ta$_2$O$_5$—OH
Ta$_2$O$_5$—OH+Al(CH$_3$)$_3$→Ta$_2$O$_5$—O—Al(CH$_3$)$_2$+CH$_4$

EXAMPLE 11

ALD deposition of TiO$_x$ on Al$_2$O$_3$. The process involves O$_2$/H$_2$/H$_2$O remote plasma that includes different ratios of the constituents. This plasma is used to terminate the surface with OH species that are reactive with TMA.

Al$_2$O$_3$+O.+H.+OH.→Al$_2$O$_3$—OH
Al$_2$O$_3$—OH+TiCl$_4$→Al$_2$O$_3$—O—TiCl$_3$+HCl

EXAMPLE 12

ALD deposition of Al$_2$O$_3$ on TiO$_x$. The process involves O$_2$/H$_2$/H$_2$O remote plasma that includes different ratios of the constituents. This plasma is used to terminate the surface with OH species that are reactive with TiCl$_4$.

TiO$_2$+O.+H.+OH.→TiO$_2$—OH
TiO$_2$—OH+Al(CH$_3$)$_3$→TiO$_2$—O—Al(CH$_3$)$_2$+CH$_4$

EXAMPLE 13

ALD deposition of TiO$_x$ on TiN. NH$_3$/H$_2$/N$_2$ plasma is used to terminate the surface with NH$_x$ species. The NH$_x$ species are reacted with TiCl$_4$ to initiate TiO$_x$ ALD.

TiN+H.+NH$_x$.→Ti—NH$_x$
Ti—NH$_x$+TiCl$_4$→TiNH$_{x-1}$—TiCl$_3$+HCl

EXAMPLE 14

ALD deposition of W on TiN. NH$_3$/H$_2$/N$_2$ plasma is used to terminate the surface with NH$_x$ species. The NH$_x$ species are reacted with TiCl$_4$ to initiate TiN ALD.

TiN+H.+NH$_x$.→Ti—NH$_x$
Ti—NH$_x$+WF$_6$→TiNH$_{x-1}$—WF$_5$+HF

EXAMPLE 15

ALD deposition of WN$_x$ on TiN. NH$_3$/H$_2$/N$_2$ plasma is used to terminate the surface with NH$_x$ species. The NH$_x$ species are reacted with TiCl$_4$ to initiate WN$_x$ ALD.

TiN+H.+NH$_x$.→Ti—NH$_x$
Ti—NH$_x$+WF$_6$→TiNH$_{x-1}$—WF$_5$+HF

EXAMPLE 16

ALD deposition of WN$_x$ on SiO$_2$. O$_2$/H$_2$/H$_2$O remote plasma that includes different ratios of the constituents is used to terminate the surface with OH species that are reactive with TiCl$_4$. The TiCl$_4$ species is used to grow an intermediate layer of Ti or TiN. The final layer is terminated with NH$_x$ species (from the TiN ALD) which reacts with WF$_6$ to initiate the WN$_x$ ALD process.

SiO$_2$+H.+O+OH.→Si—OH
Si—OH+TiCl$_4$→SiO—TiCl$_3$+HCl
SiO—TiCl$_3$+NH$_3$→SiO—TiN—NH$_x$+HCl
SiO—TiN—NH$_x$+WF$_6$→SiO—TiN—NH$_{x-1}$WF$_5$+HF

EXAMPLE 17

ALD deposition of W on SiO$_2$. O$_2$/H$_2$/H$_2$O remote plasma that includes different ratios of the constituents is used to terminate the surface with OH species that are reactive with TiCl$_4$. The TiCl$_4$ species is used to grow an intermediate layer of Ti or TiN. The final layer is terminated with NH$_x$ species (from the TiN ALD) which reacts with $WF_6$ to initiate the W ALD process.

$SiO_2 + H \cdot + O \cdot + OH \cdot \rightarrow Si\text{—}OH$ $Si\text{—}OH + TiCl_4 \rightarrow SiO\text{—}TiCl_3 + HCl$ $SiO\text{—}TiCl_3 + NH_3 \rightarrow SiO\text{—}TiN\text{—}NH_x + HCl$ $SiO\text{—}TiN\text{—}NH_x + WF_6 \rightarrow SiO\text{—}TiN\text{—}NH_{x-1}WF_5 + HF$ Alternatively, $TaCl_5$ can be used for growing an intermediate $Ta_xN$ layer.

EXAMPLE 18

ALD deposition of $WN_x$ on hydrocarbon polymer (low-k dielectric layer). $NF_3$ remote plasma generates fluorine atoms that leach out hydrogen from the hydrocarbon. The leached surface is reacted with $TiCl_4$ and followed by TiN or Ti/TiN ALD of a thin intermediate layer. The $NH_x$ terminated surface that is prepared during the TiN ALD is reacted with $WF_6$ to initiate $WN_x$ ALD.

$C_nH_m + F \cdot \rightarrow C_pH_qC \cdot$ $C_pH_qC \cdot + TiCl_4 \rightarrow C_pH_{q-1}CTiCl_3 + HCl$ $C_pH_{q-1}CTiCl_3 + NH_3 \rightarrow C_pH_{q-1}CTiN\text{—}NH_x + HCl$ $C_pH_{q-1}CTiN\text{—}NH_x + WF_6 \rightarrow C_pH_{q-1}CTiN\text{—}N_{x-1}\text{—}WF_5 + HF$

EXAMPLE 19

ALD deposition of $WN_x$ on perfluorocarbon polymer (low-k dielectric layer). $H_2/NH_3$ remote plasma generates H atoms and $NH_x$ radicals that leach out fluorine from the hydrocarbon. The leached surface is reacted with $TiCl_4$ and followed by TiN or Ti/TiN ALD of a thin intermediate layer. The $NH_x$ terminated surface that is prepared during the TiN ALD is reacted with $WF_6$ to initiate $WN_x$ ALD.

$C_mF_n + H \cdot + NH_x \cdot \rightarrow C_pF_qC \cdot + HF$ $C_pF_qC \cdot + TiCl_4 \rightarrow C_pF_qC\text{—}TiN\text{—}NH_x$ $C_pF_qC\text{—}TiN\text{—}NH_x + WF_6 \rightarrow C_pF_qC\text{—}TiNH_{x-1}\text{—}NWF_5 + HF$

EXAMPLE 20

ALD deposition of oxide on another oxide. The surface of the first oxide is activated by $O_2/H_2/H_2O$ remote plasma that includes different ratios of the constituents. This process is used to terminate the surface with OH species that are reactive with a metal precursor for the next oxide layer.

$M1O_x + O \cdot + H \cdot + OH \cdot \rightarrow M1O_x\text{—}OH$ $M1O_x\text{—}OH + M2L_y \rightarrow M1O_x\text{—}O\text{—}M2L_{y-1} + HL$

EXAMPLE 21

ALD deposition of oxide on metal, semiconductor or metal nitride. $NH_3/H_2/N_2$ plasma is used to terminate the surface with $NH_x$ species that are reactive with a metal precursor for initiating ALD.

$M1 + H \cdot + NH_x \cdot \rightarrow M1\text{—}NH_x$ $M1NH_x + M2L_y \rightarrow M1NH_{x-1}M2L_{y-1} + HL$

EXAMPLE 22

ALD deposition of metal, semiconductor or conductive metalnitride on oxide. $NH_3/H_2/N_2$ plasma is used to terminate the surface with $NH_x$ species or $O_2/H_2/H_2O$ plasma generated radicals are used to terminate the surface with OH species. The species are reactive with a metal precursor for initiating ALD.

$M1O_x + O \cdot + H \cdot + OH \cdot \rightarrow M1O_x\text{—}OH$ $M1O_x\text{—}OH + M2L_y \rightarrow M1O_x\text{—}O\text{—}M2L_{y-1} + HL$ Again, it is appreciated that the above are described as examples only and that many other ALD reactions and pretreatment procedures are available.

Figure 11:
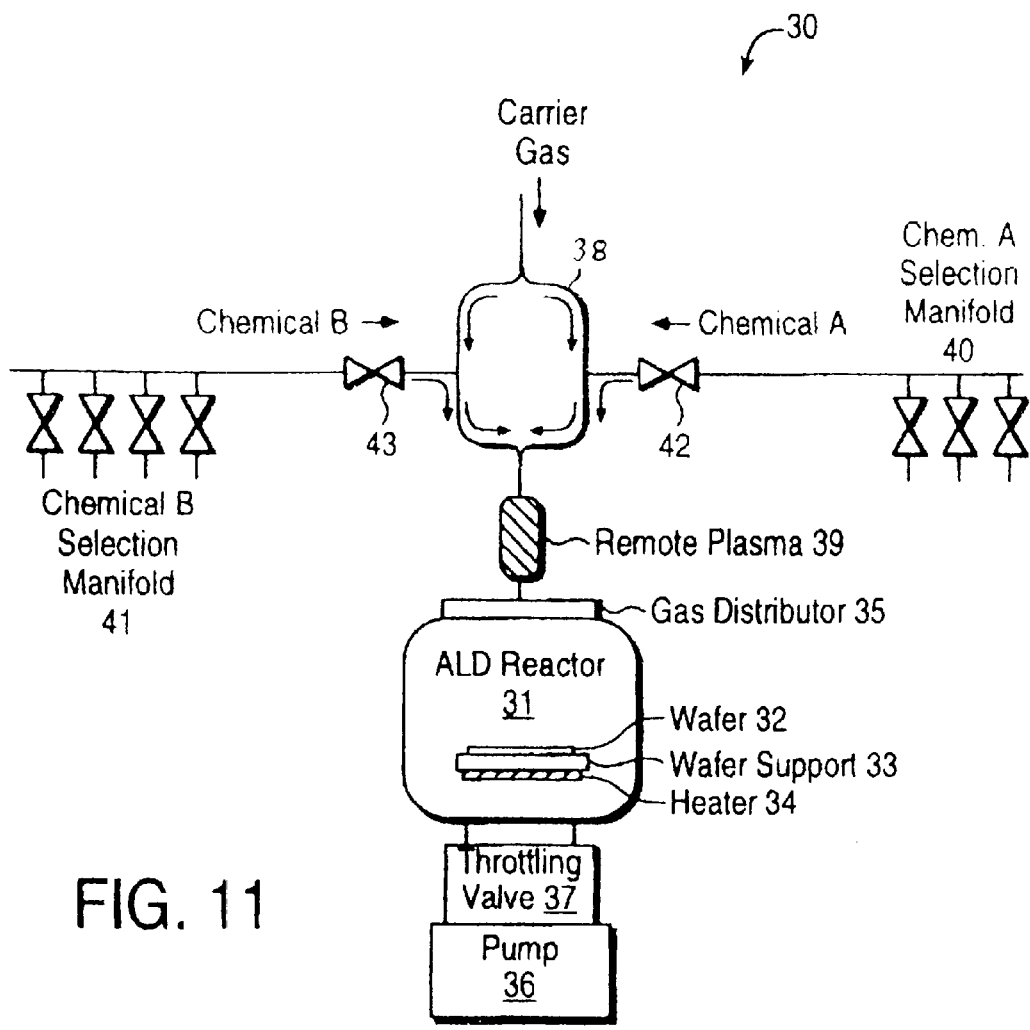
FIG. 11 is a block diagram showing one reactor apparatus for performing ALD, as well as pretreating the surface by practicing the present invention.

Referring to FIG. 11, an apparatus for practicing the present invention is shown. An ALD reactor apparatus 30 is shown as one embodiment. It is appreciated that a variety of other devices and equipment can be utilized to practice the invention. Reactor 30 includes a processing chamber 31 for housing a wafer 32. The wafer 32 comprises the substrate 20 described in the earlier Figures. Typically, the wafer 32 resides atop a support (or chuck) 33. A heater 34 is also coupled to the chuck to heat the chuck 33 and the wafer 32 for plasma deposition. The processing gases are introduced into the chamber 31 through a gas distributor 35 located at one end of the chamber 31. A vacuum pump 36 and a throttling valve 37 are located at the opposite end to draw and regulate the gas flow across the wafer surface.

A mixing manifold 38 is used to mix the various processing gases and the mixed gases are directed to a plasma forming zone 39 for forming the plasma. A variety of CVD techniques for combining gases and forming plasma can be utilized, including adapting techniques known in the art. The remotely formed plasma is then fed into gas distributor 35 and then into the chamber 31.

The mixing manifold 38 has two inlets for the introduction of gases and chemicals. A carrier gas is introduced and the flow split at the mixing manifold 38. The carrier gas is typically an inert gas, such as nitrogen. The mixing manifold 38 also has two inlets for the chemicals. In the example diagram of FIG. 11, chemical A and chemical B are shown combined with the carrier gas. Chemistry A pertains to the first precursor and chemistry B pertains to the second precursor for performing ALD for the two precursor process described above. Chemical selection manifold 40 and 41, comprised of a number of regulated valves, provide for the selecting of chemicals that can be used as precursors A and B, respectively. Inlet valves 42 and 43 respectively regulate the introduction of the precursor chemistries A and B into the mixing manifold 38.

The operation of the reactor for performing ALD is as follows. Once the wafer is resident within the processing chamber 31, the chamber environment is brought up to meet desired parameters. For example, raising the temperature of the wafer in order to perform ALD. The flow of carrier gas is turned on so that there is a constant regulated flow of the carrier gas as the gas is drawn by the vacuum created by the pump 36. When ALD is to be performed, valve 42 is opened to allow the first precursor to be introduced into the carrier gas flow. After a preselected time, valve 42 is closed and the carrier gas purges any remaining reactive species. Then, valve 43 is opened to introduce the second precursor into the carrier gas flow. Again after another preselected time, the valve 43 is closed and the carrier gas purges the reactive species form the chambers of the reactor. The two chemicals A and B are alternately introduced into the carrier flow stream to perform the ALD cycle to deposit a film layer.

When the pretreatment of the surface is to be performed by plasma, the pretreating species can be introduced into the mixing manifold through either or both of the chemical selection routes through selection manifold(s) 40, 41 to mix with the carrier gas. Again, the pretreatment is performed prior to the initial introduction of the first ALD precursor used to deposit the film. Accordingly, the introduction of the pretreatment chemistry can be achieved from adapting designs of a standard ALD reactor.

Thus, an apparatus and method to achieve continuous interface and ultrathin film during atomic layer deposition is described. The present invention allows an ALD process to start continuously without nucleation or incubation and allows ultrathin film layers of 50 angstroms or less in thickness to be deposited having continuous uniformity and/or conformity.

We claim:

1. An apparatus comprising:

a mixing manifold having a common carrier gas inlet and a split flow of carrier gas after the carrier gas inlet, said mixing manifold having a first chemical inlet to introduce a first precursor chemical in one flow path of the split flow of the carrier gas and having a second chemical inlet to introduce a second precursor chemical in a second flow path of the split flow of the carrier gas;

a reactor coupled to said mixing manifold to receive the first precursor chemical during a first time period and the second precursor chemical during a second time period to perform atomic layer deposition.

2. The apparatus of claim 1 wherein the carrier gas flows at a constant regulated flow to said reactor.

3. The apparatus of claim 1 wherein the carrier gas flows at a constant regulated flow to introduce the first precursor chemical into said reactor during the first time period and to purge the first precursor chemical from said reactor after the first time period, but prior to the second time period.

4. The apparatus of claim 3 wherein the carrier gas introduces the second precursor chemical into said reactor during the second time period and to purge the second precursor chemical from said reactor after the second time period.

5. The apparatus of claim 1 further including a plasma source coupled to said mixing manifold and said reactor to introduce plasma into said reactor.

6. The apparatus of claim 1 further including a plasma source coupled between said mixing manifold and said reactor to vertically introduce the first and second precursor chemicals and plasma into said reactor.

7. The apparatus of claim 1 further including a gas distributor disposed on said reactor to distribute the carrier gas entering said reactor.

8. The apparatus of claim 1 further including a downstream vacuum pump and throttle valve to regulate the carrier gas to have a constant regulated flow.

9. An apparatus comprising:

a mixing manifold having a common carrier gas inlet and a split flow of carrier gas after the carrier gas inlet, said mixing manifold having a first chemical inlet to introduce a first precursor chemical into a first flow path of the split flow of the carrier gas and having a second chemical inlet to introduce a second precursor chemical into a second flow path of the split flow of the carrier gas, the carrier gas having a constant regulated flow;

a reactor coupled to said mixing manifold to receive the first precursor chemical during a first time period and the second precursor chemical during a second time period to perform atomic layer deposition to deposit a film layer on a wafer.

10. The apparatus of claim 9 wherein the carrier gas purges the first precursor chemical from said reactor after the first time period, but prior to the second time period.

11. The apparatus of claim 10 wherein the carrier gas purges the second precursor chemical from said reactor after the second time period.

12. The apparatus of claim 11 further including a plasma source coupled to said mixing manifold and said reactor to introduce plasma into said reactor.

13. The apparatus of claim 11 further including a plasma source coupled between said mixing manifold and said reactor to vertically introduce the first and second precursor chemicals and plasma into said reactor.

14. The apparatus of claim 11 further including a gas distributor disposed on said reactor to distribute the carrier gas entering said reactor.

15. The apparatus of claim 10 further including a downstream vacuum pump and throttle valve to regulate the carrier gas to have the constant regulated flow.

* * * * *